US012600007B2

(12) United States Patent
Kinoshita

(10) Patent No.: US 12,600,007 B2
(45) Date of Patent: Apr. 14, 2026

(54) POLISHING APPARATUS AND POLISHING METHOD

(71) Applicant: EBARA CORPORATION, Tokyo (JP)

(72) Inventor: Masaki Kinoshita, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 493 days.

(21) Appl. No.: 17/981,297

(22) Filed: Nov. 4, 2022

(65) Prior Publication Data

US 2023/0158636 A1 May 25, 2023

(30) Foreign Application Priority Data

Nov. 11, 2021 (JP) ................................. 2021-183999

(51) Int. Cl.
| | |
|---|---|
| *B24B 49/12* | (2006.01) |
| *B24B 37/04* | (2012.01) |
| *G01B 11/06* | (2006.01) |
| *H01L 21/66* | (2006.01) |

(52) U.S. Cl.
CPC ............ *B24B 49/12* (2013.01); *B24B 37/042* (2013.01); *G01B 11/0625* (2013.01); *G01B 11/0683* (2013.01); *H01L 22/12* (2013.01)

(58) Field of Classification Search
None
See application file for complete search history.

(56) References Cited

U.S. PATENT DOCUMENTS

| | | | |
|---|---|---|---|
| 2005/0200845 A1* | 9/2005 | Nabatova-Gabain | ........................ G01N 21/211 356/369 |
| 2016/0354894 A1* | 12/2016 | Kimba | .................. B24B 37/205 |
| 2019/0027382 A1 | 1/2019 | Watanabe et al. | |
| 2019/0047117 A1 | 2/2019 | Watanabe et al. | |
| 2020/0101579 A1 | 4/2020 | Suzuki | |

FOREIGN PATENT DOCUMENTS

| | | |
|---|---|---|
| JP | H08-029119 A | 2/1996 |
| JP | 2003-114107 A | 4/2003 |
| JP | 2018-194427 A | 12/2018 |
| TW | 202128350 A | 8/2021 |
| TW | 202135983 A | 10/2021 |

* cited by examiner

*Primary Examiner* — Matthew G Marini
(74) *Attorney, Agent, or Firm* — BakerHostetler

(57) ABSTRACT

A polishing apparatus and a polishing method capable of accurately measuring a film thickness of a workpiece, such as wafer, substrate, or panel, used in manufacturing of semiconductor devices during polishing of the workpiece are disclosed. The processing system is configured to determine a film thickness of the workpiece based on relative reflectance data calculated by a calculation formula expressed as: the relative reflectance data=MD1/[BD1·k], where MD1 represents first intensity measurement data indicating intensity of the reflected light from the workpiece measured by the first spectrometer, BD1 represents the first base intensity data, and k represents a rate of change in second intensity measurement data with respect to the second base intensity data. The second intensity measurement data is indicative of intensity of the light of the light source measured by the second spectrometer during polishing of the workpiece.

13 Claims, 10 Drawing Sheets

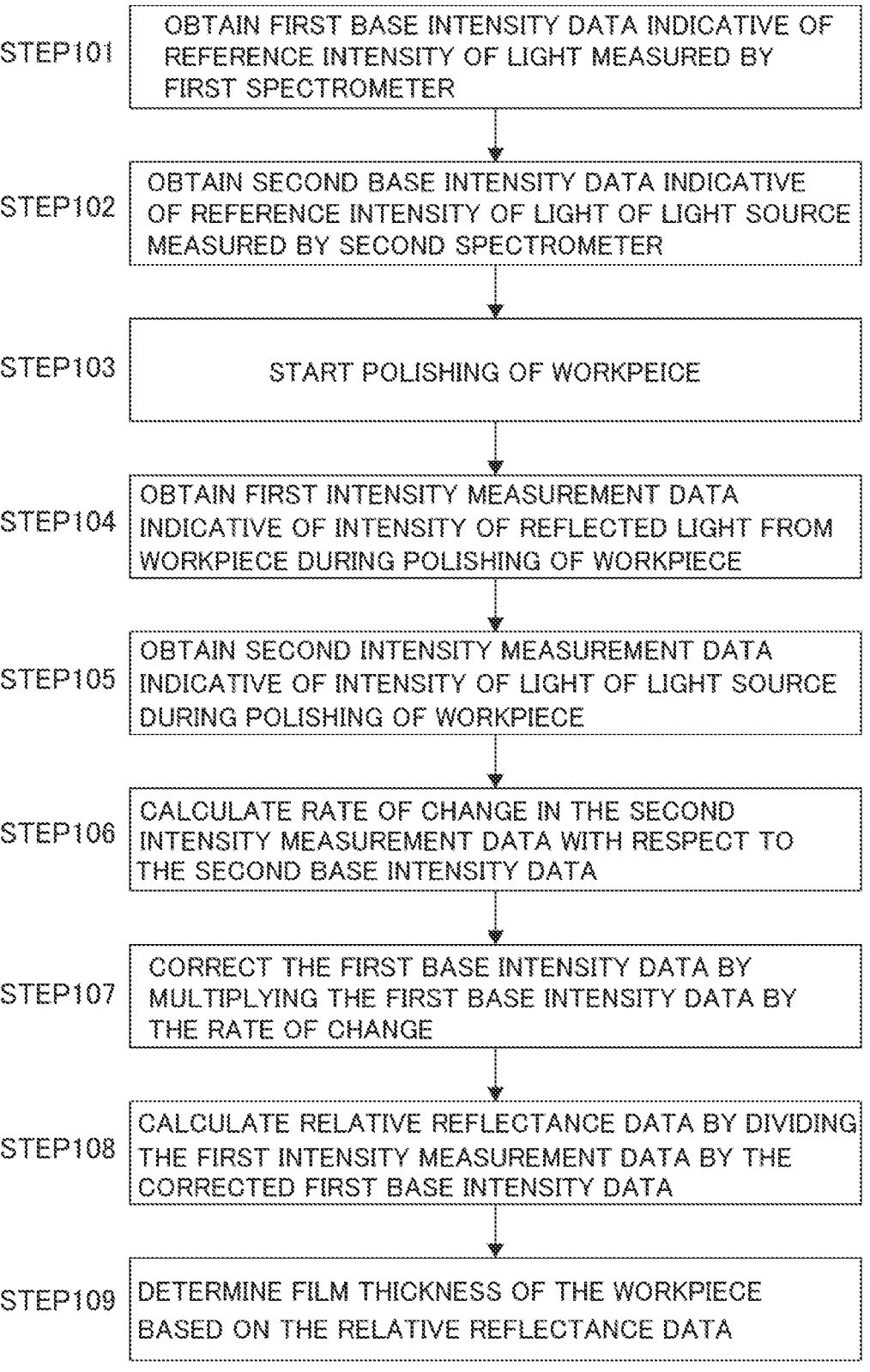

STEP101 — OBTAIN FIRST BASE INTENSITY DATA INDICATIVE OF REFERENCE INTENSITY OF LIGHT MEASURED BY FIRST SPECTROMETER

STEP102 — OBTAIN SECOND BASE INTENSITY DATA INDICATIVE OF REFERENCE INTENSITY OF LIGHT OF LIGHT SOURCE MEASURED BY SECOND SPECTROMETER

STEP103 — START POLISHING OF WORKPEICE

STEP104 — OBTAIN FIRST INTENSITY MEASUREMENT DATA INDICATIVE OF INTENSITY OF REFLECTED LIGHT FROM WORKPIECE DURING POLISHING OF WORKPIECE

STEP105 — OBTAIN SECOND INTENSITY MEASUREMENT DATA INDICATIVE OF INTENSITY OF LIGHT OF LIGHT SOURCE DURING POLISHING OF WORKPIECE

STEP106 — CALCULATE RATE OF CHANGE IN THE SECOND INTENSITY MEASUREMENT DATA WITH RESPECT TO THE SECOND BASE INTENSITY DATA

STEP107 — CORRECT THE FIRST BASE INTENSITY DATA BY MULTIPLYING THE FIRST BASE INTENSITY DATA BY THE RATE OF CHANGE

STEP108 — CALCULATE RELATIVE REFLECTANCE DATA BY DIVIDING THE FIRST INTENSITY MEASUREMENT DATA BY THE CORRECTED FIRST BASE INTENSITY DATA

STEP109 — DETERMINE FILM THICKNESS OF THE WORKPIECE BASED ON THE RELATIVE REFLECTANCE DATA

FIG. 10

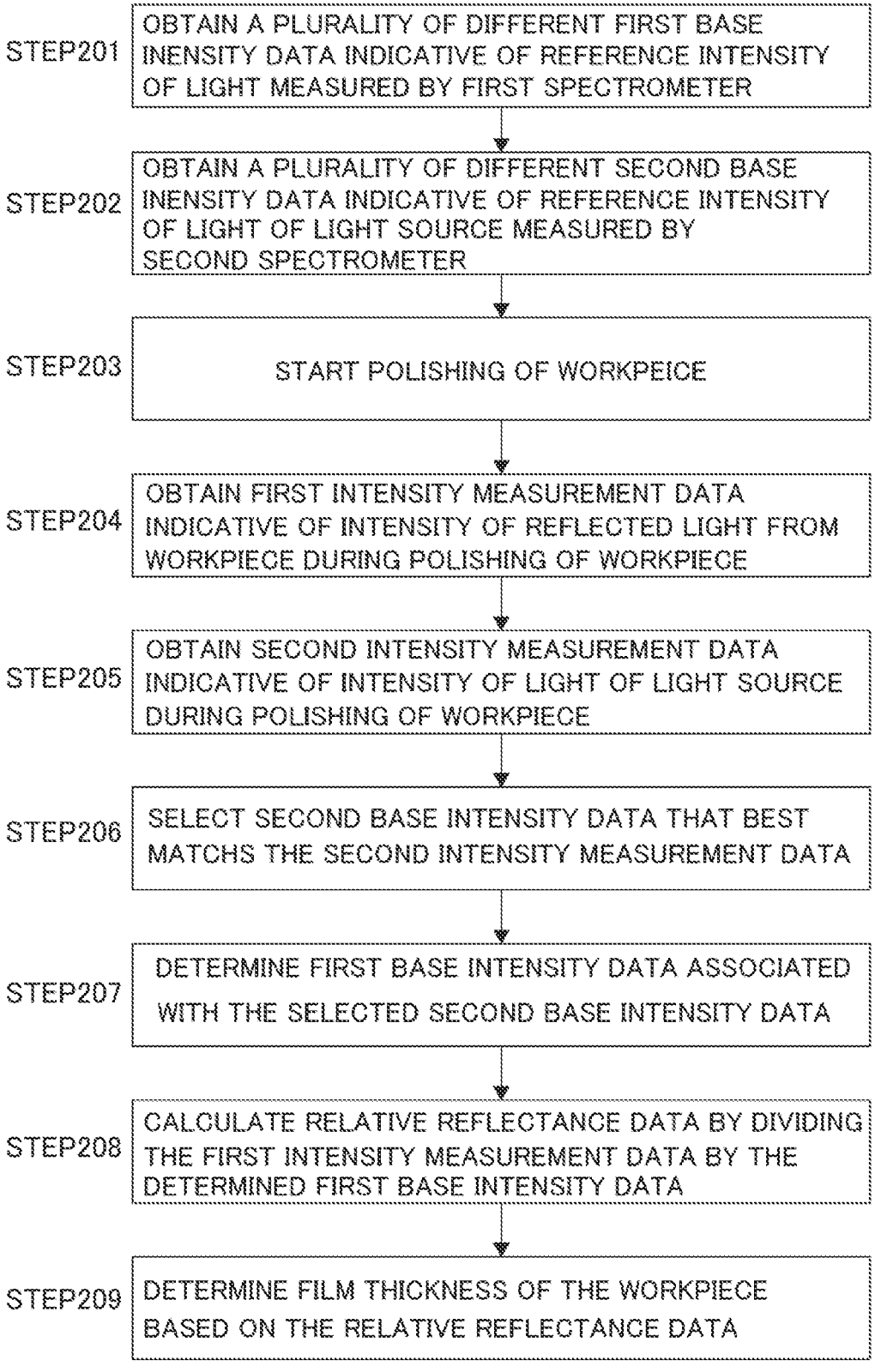

STEP201　OBTAIN A PLURALITY OF DIFFERENT FIRST BASE INENSITY DATA INDICATIVE OF REFERENCE INTENSITY OF LIGHT MEASURED BY FIRST SPECTROMETER

STEP202　OBTAIN A PLURALITY OF DIFFERENT SECOND BASE INENSITY DATA INDICATIVE OF REFERENCE INTENSITY OF LIGHT OF LIGHT SOURCE MEASURED BY SECOND SPECTROMETER

STEP203　START POLISHING OF WORKPEICE

STEP204　OBTAIN FIRST INTENSITY MEASUREMENT DATA INDICATIVE OF INTENSITY OF REFLECTED LIGHT FROM WORKPIECE DURING POLISHING OF WORKPIECE

STEP205　OBTAIN SECOND INTENSITY MEASUREMENT DATA INDICATIVE OF INTENSITY OF LIGHT OF LIGHT SOURCE DURING POLISHING OF WORKPIECE

STEP206　SELECT SECOND BASE INTENSITY DATA THAT BEST MATCHS THE SECOND INTENSITY MEASUREMENT DATA

STEP207　DETERMINE FIRST BASE INTENSITY DATA ASSOCIATED WITH THE SELECTED SECOND BASE INTENSITY DATA

STEP208　CALCULATE RELATIVE REFLECTANCE DATA BY DIVIDING THE FIRST INTENSITY MEASUREMENT DATA BY THE DETERMINED FIRST BASE INTENSITY DATA

STEP209　DETERMINE FILM THICKNESS OF THE WORKPIECE BASED ON THE RELATIVE REFLECTANCE DATA

POLISHING APPARATUS AND POLISHING METHOD

CROSS REFERENCE TO RELATED APPLICATION

This document claims priority to Japanese Patent Application No. 2021-183999 filed Nov. 11, 2021, the entire contents of which are hereby incorporated by reference.

BACKGROUND

In a manufacturing process of a semiconductor device, various materials are repeatedly formed in film shapes on a silicon wafer to form a multilayer structure. In order to form such multilayer structure, a technique of planarizing a surface of an uppermost layer of the multilayer structure is becoming important. Chemical mechanical polishing (CMP) is used as one of such planarizing techniques.

The chemical mechanical polishing (CMP) is performed by a polishing apparatus. This type of polishing apparatus generally includes a polishing table that supports a polishing pad, a polishing head configured to hold a wafer having a film, and a polishing-liquid supply nozzle configured to supply a polishing liquid (for example, slurry) onto the polishing pad. The polishing apparatus is configured to supply the polishing liquid onto the polishing pad from the polishing-liquid supply nozzle while rotating the polishing head and the polishing table. The polishing head presses a surface of the wafer against the polishing pad to polish a film forming the surface of the wafer in the presence of the polishing liquid between the wafer and the polishing pad.

In order to measure a thickness of a non-metallic film, such as an insulating film or a silicon layer (hereinafter simply referred to as film thickness), the polishing apparatus generally includes an optical film-thickness measuring device. This optical film-thickness measuring device is configured to determine the film thickness of the wafer by directing light emitted by a light source to the surface of the wafer and analyzing a spectrum of reflected light from the wafer. The polishing apparatus can terminate polishing of the wafer or can change polishing conditions for the wafer based on the determined film thickness.

However, the spectrum of the reflected light from the wafer may vary even under the same conditions (e.g., same film thickness, same measuring point). Such a variation in the spectrum may lower stable measuring of a film thickness and may prevent accurate monitoring of a film thickness during polishing of a wafer. There is a film-thickness measuring device configured to measure a film thickness of a stationary wafer. This type of film-thickness measuring device can repeatedly measure a film thickness at the same measuring point and can obtain a stable measurement result by calculating an average of the obtained multiple measurement values. However, the optical film-thickness measuring device described above dynamically measures the film thickness of the wafer while the wafer is rotating, and such a process cannot be performed.

SUMMARY

Accordingly, there are provided a polishing apparatus and a polishing method capable of accurately measuring a film thickness of a workpiece, such as wafer, substrate, or panel, used in manufacturing of semiconductor devices during polishing of the workpiece.

Embodiments, which will be described below, relate to a polishing apparatus and a polishing method for polishing a workpiece, such as wafer, substrate, or panel, used in manufacturing of semiconductor devices and in particular relates to a technique for determining a film thickness of the workpiece based on optical information contained in reflected light from the workpiece.

The inventor has found that there are two reasons why a spectrum of reflected light from the workpiece is not stable.

The first reason is that a quantity of light from a light source may vary each time the light source emits light. In particular, in a flash light source configured to emit light by electric discharge, the quantity of light in each light emission is likely to vary due to fluctuation in the electric discharge. During polishing of the workpiece, the light source flashes multiple times to illuminate multiple measuring points on the workpiece in each rotation of the polishing table. There is a slight variation in the quantity of light that illuminates these measuring points.

The second reason is that each time the light source emits light, a path of the light traveling through an optical fiber cable may vary. The light source is coupled to the optical fiber cable through which the light is directed to the workpiece. The light source with a small irradiation diameter irradiates a different position on an end surface of the optical fiber cable each time the light source emits the light. As a result, the light is directed to the workpiece through a different part of the optical fiber cable. Such difference in optical path in the optical fiber cable may cause a variation in spectrum of the reflected light from the workpiece.

Accordingly, in an embodiment, there is provided a polishing apparatus for polishing a workpiece, comprising: a polishing table configured to support a polishing pad; a polishing head configured to press the workpiece against the polishing pad to polish the workpiece; a light source configured to emit light; a light-emitting optical fiber cable coupled to the light source and configured to direct the light to the workpiece; a light-receiving optical fiber cable configured to receive reflected light from the workpiece; a first spectrometer coupled to the light-receiving optical fiber cable; a second spectrometer directly coupled to the light source; and a processing system including a memory storing a program and an arithmetic device configured to perform an arithmetic operation according to instructions included in the program, the memory storing therein first base intensity data indicating reference intensity of light measured by the first spectrometer before polishing of the workpiece, the memory storing therein second base intensity data indicating reference intensity of the light of the light source measured by the second spectrometer before polishing of the workpiece, the memory storing therein a calculation formula for calculating relative reflectance data, the processing system being configured to determine a film thickness of the workpiece based on the relative reflectance data, the calculation formula being expressed as $$\text{the relative reflectance data} = MD1/[BD1 \cdot k]$$

where MD1 represents first intensity measurement data indicating intensity of the reflected light from the workpiece measured by the first spectrometer, BD1 represents the first base intensity data, and k represents a rate of change in second intensity measurement data with respect to the second base intensity data, and the second intensity measurement data is indicative of intensity of the light of the light source measured by the second spectrometer during polishing of the workpiece.

In an embodiment, each of the first base intensity data, the second base intensity data, the first intensity measurement data, and the second intensity measurement data is data indicating intensities of light at a plurality of wavelengths, and the rate of change k comprises a plurality of rates of change corresponding to the plurality of wavelengths, respectively.

In an embodiment, the processing system is configured to: perform interpolation on the first base intensity data, the first intensity measurement data, the second base intensity data, and the second intensity measurement data such that the plurality of wavelengths of the first base intensity data and the first intensity measurement data coincide with the plurality of wavelengths of the second base intensity data and the second intensity measurement data; and then calculate the plurality of rates of change k.

In an embodiment, the plurality of wavelengths of the first base intensity data, the second base intensity data, the first intensity measurement data, and the second intensity measurement data are a plurality of integer wavelengths.

In an embodiment, the rate of change k is a rate of change in a representative intensity value of the second intensity measurement data with respect to a representative intensity value of the second base intensity data.

In an embodiment, the first spectrometer and the second spectrometer are configured to simultaneously measure the intensity of the reflected light from the workpiece and the intensity of the light of the light source.

In an embodiment, the polishing apparatus further comprises a direct-coupling optical fiber cable that directly couples the light source to the second spectrometer.

In an embodiment, there is provided a polishing apparatus for polishing a workpiece, comprising: a polishing table configured to support a polishing pad; a polishing head configured to press the workpiece against the polishing pad to polish the workpiece; a light source configured to emit light; a light-emitting optical fiber cable coupled to the light source and configured to direct the light to the workpiece; a light-receiving optical fiber cable configured to receive reflected light from the workpiece; a first spectrometer coupled to the light-receiving optical fiber cable; a second spectrometer directly coupled to the light source; and a processing system including a memory storing a program and an arithmetic device configured to perform an arithmetic operation according to instructions included in the program, the memory storing therein a plurality of different first base intensity data each indicative of reference intensity of light measured by the first spectrometer before polishing of the workpiece, the memory storing therein a plurality of different second base intensity data each indicative of reference intensity of the light of the light source measured by the second spectrometer before polishing of the workpiece, the plurality of different first base intensity data being associated with the plurality of different second base intensity data in one-to-one correspondence relationship, the processing system being configured to: obtain first intensity measurement data indicative of intensity of the reflected light from the workpiece measured by the first spectrometer; obtain second intensity measurement data indicative of intensity of the light of the light source measured by the second spectrometer during polishing of the workpiece; select second base intensity data that best matches the second intensity measurement data from the plurality of different second base intensity data; determine first base intensity data associated with the selected second base intensity data; calculate relative reflectance data by dividing the first intensity measurement data by the determined first base intensity data; and determine a film thickness of the workpiece based on the relative reflectance data.

In an embodiment, the first spectrometer and the second spectrometer are configured to simultaneously measure the intensity of the reflected light from the workpiece and the intensity of the light of the light source during polishing of the workpiece.

In an embodiment, the polishing apparatus further comprises a direct-coupling optical fiber cable that directly couples the light source to the second spectrometer, an end of the light-emitting optical fiber cable and an end of the direct-coupling optical fiber cable being bundled together to form a trunk optical fiber cable, and the trunk optical fiber cable being coupled to the light source.

In an embodiment, there is provided a polishing method of polishing a workpiece, comprising: before polishing of the workpiece, directing light, emitted by a light source, through a light-emitting optical fiber cable and a light-receiving optical fiber cable to a first spectrometer, and measuring intensity of the light by the first spectrometer to generate first base intensity data indicative of reference intensity of the light; before polishing of the workpiece, measuring intensity of the light, emitted by the light source, by a second spectrometer to generate second base intensity data indicative of reference intensity of the light, the second spectrometer being directly coupled to the light source; polishing the workpiece by pressing the workpiece against a polishing pad on a polishing table while rotating the polishing table; obtaining first intensity measurement data indicative of intensity of reflected light from the workpiece measured by the first spectrometer during polishing of the workpiece; obtaining second intensity measurement data indicative of intensity of the light of the light source measured by the second spectrometer during polishing of the workpiece; calculating a rate of change in the second intensity measurement data with respect to the second base intensity data; calculating corrected first base intensity data by multiplying the first base intensity data by the rate of change; calculating relative reflectance data by dividing the first intensity measurement data by the corrected first base intensity data; and determining a film thickness of the workpiece based on the relative reflectance data.

In an embodiment, each of the first base intensity data, the second base intensity data, the first intensity measurement data, and the second intensity measurement data is data indicating intensities of light at a plurality of wavelengths, and the rate of change comprises a plurality of rates of change corresponding to the plurality of wavelengths, respectively.

In an embodiment, the polishing method further comprises performing interpolation on the first base intensity data, the first intensity measurement data, the second base intensity data, and the second intensity measurement data such that the plurality of wavelengths of the first base intensity data and the first intensity measurement data coincide with the plurality of wavelengths of the second base intensity data and the second intensity measurement data, the interpolation being performed before calculating the plurality of rates of change.

In an embodiment, the plurality of wavelengths of the first base intensity data, the second base intensity data, the first intensity measurement data, and the second intensity measurement data are a plurality of integer wavelengths.

In an embodiment, the rate of change is a rate of change in a representative intensity value of the second intensity measurement data with respect to a representative intensity value of the second base intensity data.

In an embodiment, the first spectrometer and the second spectrometer simultaneously measure the intensity of the reflected light from the workpiece and the intensity of the light from the light source.

In an embodiment, there is provided a polishing method of polishing a workpiece, comprising: before polishing of the workpiece, repeatedly emitting light by a light source and transmitting the light through a light-emitting optical fiber cable and a light-receiving optical fiber cable to a first spectrometer; measuring intensity of the light by the first spectrometer to generate a plurality of different first base intensity data indicative of reference intensity of the light; measuring intensity of the light, repeatedly emitted by the light source, by a second spectrometer to generate a plurality of different second base intensity data indicative of reference intensity of the light from the light source, the second spectrometer being directly coupled to the light source; associating the plurality of different first base intensity data with the plurality of different second base intensity data in one-to-one correspondence relationship; polishing the workpiece by pressing the workpiece against a polishing pad on a polishing table while rotating the polishing table; obtaining first intensity measurement data indicative of intensity of reflected light from the workpiece measured by the first spectrometer during polishing of the workpiece; obtaining second intensity measurement data indicative of intensity of the light of the light source measured by the second spectrometer during polishing of the workpiece; selecting second base intensity data that best matches the second intensity measurement data from the plurality of different second base intensity data; determining first base intensity data associated with the selected second base intensity data; calculating relative reflectance data by dividing the first intensity measurement data by the determined first base intensity data; and determining a film thickness of the workpiece based on the relative reflectance data.

In an embodiment, the first spectrometer and the second spectrometer simultaneously measure the intensity of the reflected light from the workpiece and the intensity of the light from the light source during polishing of the workpiece.

The second base intensity data is original reference data, and the second intensity measurement data is reference data during polishing. According to the above-described embodiments, the rate of change in the second intensity measurement data with respect to the second base intensity data is used to correct the first base intensity data. Further, the first intensity measurement data obtained during polishing of the workpiece is divided by the corrected first base intensity data, so that the relative reflectance data is obtained. Such calculations remove the variation in the quantity of light of the light source from the relative reflectance data. As a result, an accurate film thickness can be determined from the relative reflectance data.

Furthermore, according to the above-described embodiments, the second base intensity data that best matches the second intensity measurement data(i.e., coincides with the second intensity measurement data most) is selected from the plurality of different base second intensity data. The plurality of different second base intensity data vary due to different optical paths of light traveling through the optical fiber cable. The second base intensity data that best matches the second intensity measurement data is data that reflects such difference in optical path. Therefore, the first base intensity data associated with the selected second base intensity data is also data reflecting the difference in the optical path. The operation of dividing the first intensity measurement data by the first base intensity data can determine the relative reflectance data from which the difference in optical path in the optical fiber cable is eliminated. As a result, an accurate film thickness can be determined from the relative reflectance data.

BRIEF DESCRIPTION OF THE DRAWINGS

FIG. 5 shows a spectrum generated from relative reflectance data;

FIG. 6 is a flow chart describing one embodiment of a polishing method for polishing a workpiece;

FIG. 10 is a flow chart describing one embodiment of a polishing method for polishing a workpiece.

DESCRIPTION OF EMBODIMENTS

Hereinafter, embodiments will be described below with reference to the drawings.

Figure 1:
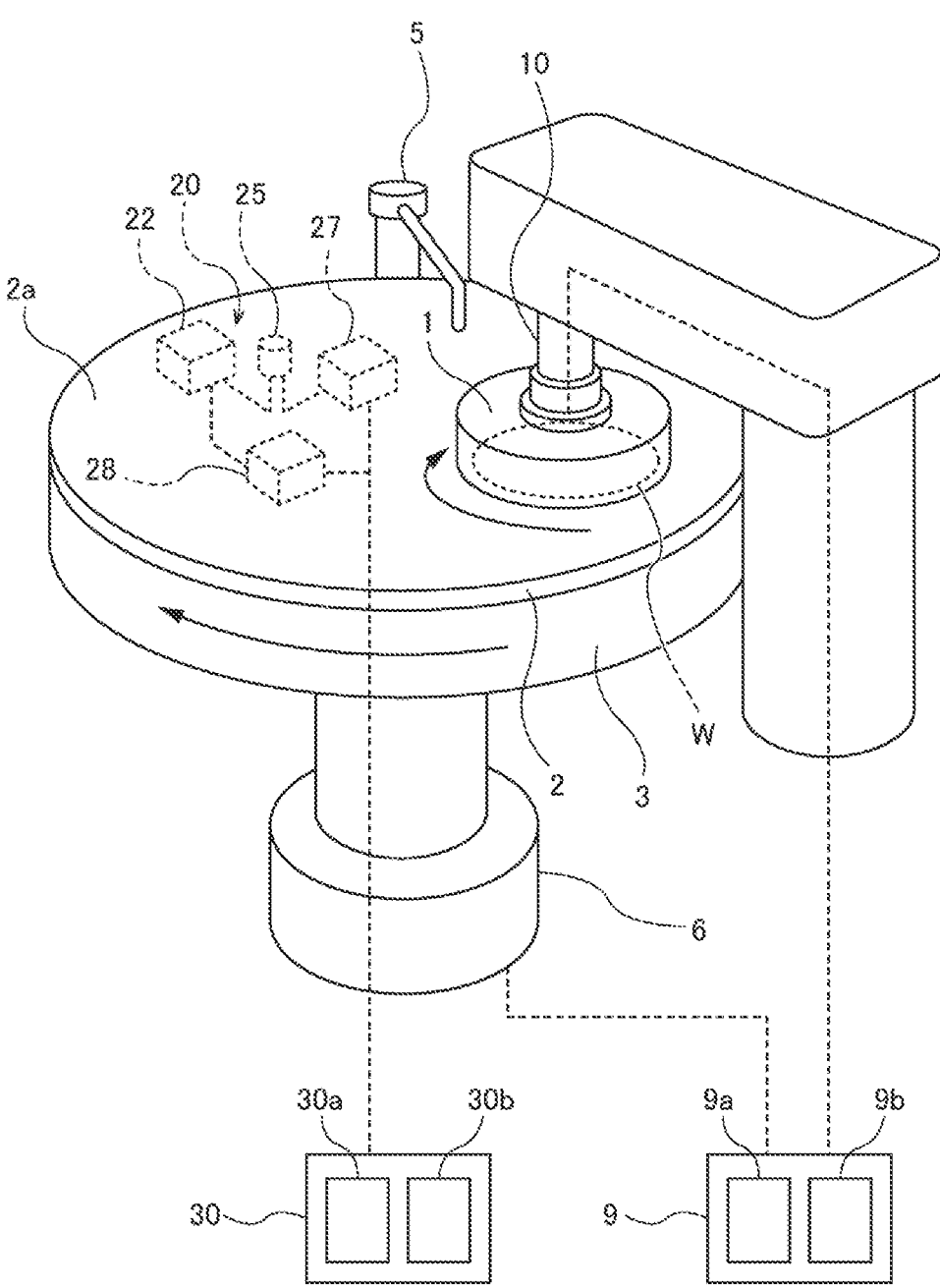
FIG. 1 is a schematic diagram showing one embodiment of a polishing apparatus.

FIG. 1 is schematic view showing an embodiment of a polishing apparatus. As shown in FIG. 1, the polishing apparatus includes a polishing table 3 configured to support a polishing pad 2, a polishing head 1 configured to press a workpiece W having a film against the polishing pad 2, a table motor 6 configured to rotate the polishing table 3, a polishing-liquid supply nozzle 5 configured to supply polishing liquid, such as slurry, onto the polishing pad 2, and an operation controller 9 configured to control operations of the polishing apparatus. The polishing pad 2 has an upper surface that provides a polishing surface 2a for polishing the workpiece W. Examples of the workpiece W include wafer, substrate, panel, etc. used in manufacturing of semiconductor devices.

The polishing head 1 is coupled to a head shaft 10, which is coupled to a polishing-head motor (now shown). The polishing-head motor is configured to rotate the polishing head 1 together with the head shaft 10 in a direction indicated by an arrow. The polishing table 3 is coupled to the table motor 6, which is configured to rotate the polishing table 3 and the polishing pad 2 in a direction indicated by an arrow. The polishing head 1, the polishing-head motor, and the table motor 6 are coupled to the operation controller 9.

The workpiece W is polished as follows. While the polishing table 3 and the polishing head 1 are rotated in the directions indicated by the arrows in FIG. 1, the polishing liquid is supplied onto the polishing surface 2*a* of the polishing pad 2 from the polishing-liquid supply nozzle 5. While the workpiece W is rotated by the polishing head 1, the workpiece W is pressed by the polishing head 1 against the polishing surface 2*a* of the polishing pad 2 in the presence of the polishing liquid on the polishing pad 2. A surface of the workpiece W is polished by a chemical action of the polishing liquid and a mechanical action of abrasive grains contained in the polishing liquid and the polishing pad 2.

The operation controller 9 includes a memory 9*a* storing programs therein, and a processor 9*b* configured to perform arithmetic operations according to instructions included in the programs. The operation controller 9 is composed of at least one computer. The memory 9*a* includes a main memory, such as a random access memory (RAM) and an auxiliary memory, such as a hard disk drive (HDD) or solid state drive (SSD). Examples of the processor 9*b* include a CPU (central processing unit) and a GPU (graphic processing unit). However, the specific configurations of the operation controller 9 are not limited to these examples.

The polishing apparatus includes an optical film-thickness measuring device 20 configured to measure a film thickness of the workpiece W. The optical film-thickness measuring device 20 includes a light source 22 configured to emit light, an optical sensor head 25 configured to direct the light from the light source 22 to the workpiece W and receive reflected light from the workpiece W, a first spectrometer 27 coupled to the optical sensor head 25, a second spectrometer 28 directly coupled to the light source 22, and a processing system 30 configured to determine a film thickness of the workpiece W based on relative reflectance data of the reflected light from the workpiece W. The optical sensor head 25 is arranged in the polishing table 3 and rotates together with the polishing table 3. In an embodiment, a plurality of optical sensor heads 25 coupled to the first spectrometer 27 and the light source 22 may be provided.

The processing system 30 includes a memory 30*a* storing programs therein, and an arithmetic device 30*b* configured to perform arithmetic operations according to instructions included in the programs. The processing system 30 includes at least one computer. The memory 30*a* includes a main memory, such as a random access memory (RAM), and an auxiliary memory, such as a hard disk drive (HDD) or solid state drive (SSD). Examples of the arithmetic device 30*b* include a CPU (central processing unit) and a GPU (graphic processing unit). However, the specific configurations of the processing system 30 are not limited to these examples.

Each of the operation controller 9 and the processing system 30 may be composed of a plurality of computers. For example, each of the operation controller 9 and the processing system 30 may be configured from a combination of edge server and cloud server. In one embodiment, the operation controller 9 and processing system 30 may be composed of a single computer.

Figure 2:
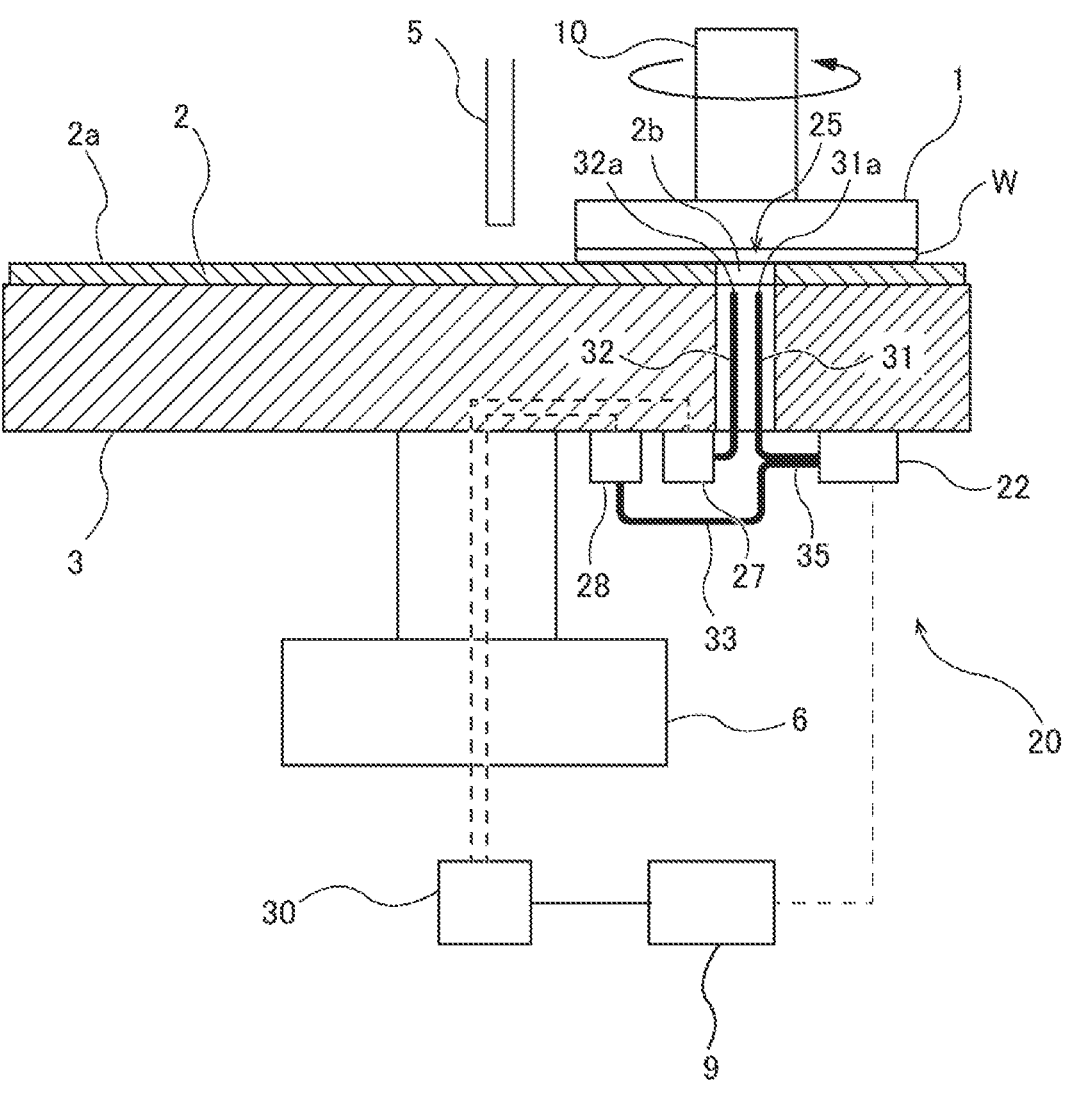
FIG. 2 is a cross-sectional view showing detailed configurations of an optical film-thickness measuring device.

FIG. 2 is a cross-sectional view showing detailed configurations of the optical film-thickness measuring device 20. The optical film-thickness measuring device 20 includes a light-emitting optical fiber cable 31 coupled to the light source 22, a light-receiving optical fiber cable 32 coupled to the first spectrometer 27, and a direct-coupling optical fiber cable 33 coupling the light source 22 to the second spectrometer 28 directly. A distal end 31*a* of the light-emitting optical fiber cable 31 and a distal end 32*a* of the light-receiving optical fiber cable 32 constitute the optical sensor head 25. Specifically, the light-emitting optical fiber cable 31 directs the light from the light source 22 to the workpiece W on the polishing pad 2, and the light-receiving optical fiber cable 32 receives the reflected light from the workpiece W and transmits the reflected light to the first spectrometer 27. One end of the direct-coupling optical fiber cable 33 is coupled to the light source 22 and the other end is coupled to the second spectrometer 28.

The first spectrometer 27 and the second spectrometer 28 are coupled to the processing system 30. The light-emitting optical fiber cable 31, the light-receiving optical fiber cable 32, the direct-coupling optical fiber cable 33, the light source 22, the first spectrometer 27, and the second spectrometer 28 are mounted to the polishing table 3 and rotate together with the polishing table 3 and the polishing pad 2. The optical sensor head 25, which is composed of the distal end 31*a*, of the light-emitting optical fiber cable 31 and the distal end 32*a* of the light-receiving optical fiber cable 32, is arranged so as to face the surface of the workpiece W on the polishing pad 2. The position of the optical sensor head 25 is such that the optical sensor head 25 traverses the surface of the workpiece W on the polishing pad 2 each time the polishing table 3 and polishing pad 2 make one rotation. The polishing pad 2 has a through-hole 2*b* located above the optical sensor head 25. The optical sensor head 25 irradiates the workpiece W with the light through the through-hole 2*b* and receives the reflected light from the workpiece W through the through-hole 2*b* each time the polishing table 3 makes one rotation.

The light source 22 is a flash light source configured to repeatedly emit light at short time intervals. Examples of the light source 22 include xenon flash lamp. The light source 22 is electrically coupled to the operation controller 9 and emits the light upon receiving a trigger signal sent from the operation controller 9. More specifically, while the optical sensor head 25 sweeps across the surface of the workpiece W on the polishing pad 2 the light source 22 receives multiple trigger signals from the operation controller 9 and emits the light multiple times. Therefore, the light is directed to multiple measuring points on the workpiece W each time the polishing table 3 makes one rotation.

The second spectrometer 28 is directly coupled to the light source 22 by the direct-coupling optical fiber cable 33. The direct-coupling optical fiber cable 33 extends from the light source 22 to the second spectrometer 28. The second spectrometer 28 is not coupled to the optical sensor head 25 and receives the light only from the light source 22. The end of the light-emitting optical fiber cable 31 and the end of the direct-coupling optical fiber cable 33 are bundled together to form one trunk optical fiber cable 35. This trunk optical fiber cable 35 is coupled to the light source 22. Specifically, the trunk optical fiber cable 35 branches into the light-emitting optical fiber cable 31 and the direct-coupling optical fiber cable 33. Therefore, the light emitted by the light source 22 splits into two lights, which are transmitted to the optical sensor head 25 and the second spectrometer 28 through the light-emitting optical fiber cable 31 and the direct-coupling optical fiber cable 33, respectively.

Each of the light-emitting optical fiber cable 31 and the direct-coupling optical fiber cable 33 may be a bundle of a plurality of thin optical fibers (strand optical fibers).

The light emitted by the light source 22 is simultaneously transmitted to the optical sensor head 25 and the second spectrometer 28. Specifically, the light is transmitted through the light-emitting optical fiber cable 31 to the optical sensor head 25 and emitted from the optical sensor head 25. The light travels through the through-hole 2*b* of the polishing pad 2 and is incident on the workpiece W on the polishing pad 2. The reflected light from the workpiece W travels through the through-hole 2*b* of the polishing pad 2 again and is received by the optical sensor head 25. The reflected light from the workpiece W is transmitted through the light-receiving optical fiber cable 32 to the first spectrometer 27. At the same time, the light emitted by the light source 22 is transmitted to the second spectrometer 28 through the direct-coupling optical fiber cable 33 without being sent to the optical sensor head 25.

The first spectrometer 27 and the second spectrometer 28 are configured to decompose the light according to its wavelengths and measure the intensity of the reflected light at each of the wavelengths over a predetermined wavelength range. Specifically, the first spectrometer 27 decomposes the reflected light from the workpiece W according to its wavelengths and measures the intensity of the reflected light at each of the wavelengths over a predetermined wavelength range to generate first intensity measurement data. At the same time, the second spectrometer 28 decomposes the light of the light source 22 according to its wavelengths and measures the intensity of the light at each of the wavelengths over the wavelength range to generate second intensity measurement data. The intensity of light emitted by the light source 22 is measured simultaneously by the first spectrometer 27 and the second spectrometer 28. The first intensity measurement data and the second intensity measurement data are sent to the processing system 30.

The memory 30*a* of the processing system 30 stores therein first base intensity data indicating reference intensity of light measured by the first spectrometer 27 in advance before polishing of the workpiece W. The memory 30*a* of the processing system 30 further stores therein second base intensity data indicating reference intensity of the light of the light source 22 measured by the second spectrometer 28 in advance before polishing of the workpiece W. The first base intensity data and the second base intensity data are data obtained in advance before polishing of the workpiece W, while the first intensity measurement data and the second intensity measurement data discussed above are data obtained during polishing of the workpiece W.

Each of the first base intensity data, the second base intensity data, the first intensity measurement data, and the second intensity measurement data indicates intensifies of light at wavelengths within the predetermined wavelength range. For example, the first intensity measurement data indicates multiple intensities at multiple wavelengths of the reflected light from the workpiece W. The multiple intensities of light indicated by the above data may be intensities relative to dark levels (which are background intensities obtained under a condition that light is cut off) as light intensity reference. Specifically, an intensity of light included in each data may be a value obtained by subtracting a dark level from a measured intensity of light at each wavelength. For example, a light intensity E(λ) at a wavelength λ included in each data may be given by $$E(\lambda)=M(\lambda)-D(\lambda) \tag{1}$$

where λ represents a wavelength, M(λ) represents a measured value of light intensity at wavelength λ, and D(λ) represents a dark level at wavelength λ.

It is noted, however, that the light intensity of each data is not limited to this example. In an embodiment, the light intensities may be measured values as they are obtained by the first spectrometer 27 and the second spectrometer 28.

The first intensity measurement data indicating the intensities of the reflected light from the workpiece W contains information on a film thickness of the workpiece W. In other words, the first intensity measurement data varies depending on the film thickness of the workpiece W. Accordingly, the processing system 30 can determine the film thickness of the workpiece W by processing the first intensity measurement data, as described below.

In contrast, the first base intensity data indicates the reference intensity of light measured in advance for each wavelength. The first base intensity data is obtained, for example, by irradiating a mirror with the light from the optical sensor head 25 and measuring intensity of reflected light from the mirror by the first spectrometer 27. Alternatively, the first base intensity data may be obtained by measuring intensity of reflected light from a silicon wafer (or a bare wafer) having no film thereon by the first spectrometer 27 when the silicon wafer is water-polished or slurry-polished on the polishing pad 2 in the presence of water or slurry on the polishing pad 2, or when the silicon wafer (or the bare wafer) is placed on the polishing pad 2.

In the present embodiment, the relative reflectance data is determined by dividing the first intensity measurement data by the first base intensity data. The relative reflectance data is index (indexes) that indicates the intensity of the reflected light at each wavelength. By dividing the first intensity measurement data by the first base intensity data, unwanted noise (e.g., a variation in intensity inherent in the optical system of the apparatus and the light source 22) can be removed from the measured intensity.

Both the second base intensity data and the second intensity measurement data are measurement data of the intensity of the light of the light source 22 and are independent of the intensity of the reflected light from the workpiece W. The second base intensity data is data indicating the reference intensity of the light of the light source 22, and the second intensity measurement data is data indicating the intensity of the light of the light source 22 while the workpiece W is being polished. In this embodiment, the second intensity measurement data and the second base intensity data are used for correction coefficient for eliminating a variation in the relative reflectance data caused by a change in the quantity of light of the light source 22 among the measurement points.

The second base intensity data is obtained before polishing of the workpiece W at the same timing as the above-described first base intensity data is obtained. Specifically, the first spectrometer 27 measures the intensities of light transmitted from the optical sensor head 25 over the predetermined wavelength range, while at the same time the second spectrometer 28 measures the intensities of light from the light source 22 over the same wavelength range.

The second intensity measurement data is obtained during polishing of the workpiece W at the same timing as the above-described first intensity measurement data is obtained. Specifically, the first spectrometer 27 measures the intensities of the reflected light from the workpiece W transmitted from the optical sensor head 25 over the predetermined wavelength range during polishing of the workpiece W, while at the same time the second spectrometer 28 measures the intensities of the light from the light source 22 over the same wavelength range during polishing of the workpiece W.

The memory 30*a* of the processing system 30 has a calculation formula stored therein for calculating the relative reflectance data. The processing system 30 is configured to determine the film thickness of the workpiece W based on the relative reflectance data. The above calculation formula is expressed as $$\text{Relative reflectance data}=MD1/[BD1{\cdot}k] \qquad (2)$$

where, MD1 represents the first intensity measurement data indicating the intensity of the reflected light from the workpiece W measured by the first spectrometer 27 during polishing of the workpiece W, BD1 represents the first base intensity data indicating the reference intensity of the light measured by the first spectrometer 27 before polishing of the workpiece W, and k is rate of change in the second intensity measurement data with respect to the second base intensity data, wherein the second intensity measurement data indicates the intensity of the light of the light source 22 measured by the second spectrometer 28 during polishing of the workpiece W.

The change in the second intensity measurement data with respect to the second base intensity data does not depend on a change in the film thickness of the workpiece W, and depends only on the change in the quantity of light of the light source 22. Therefore, the operation of multiplying the first base intensity data by the rate of change k can correct the first base intensity data. Specifically, the change in the quantity of light of the light source 22 is reflected in the first base intensity data. As well as the second intensity measurement data, the first intensity measurement data MD1 reflects the change in the quantity of light of the light source 22. Therefore, the operation of dividing the first intensity measurement data MD1 by the corrected first base intensity data can remove (or cancel) the change in the quantity of light of the light source 22. As a result, the processing system 30 can determine an accurate film thickness from the relative reflectance data.

Figure 3:
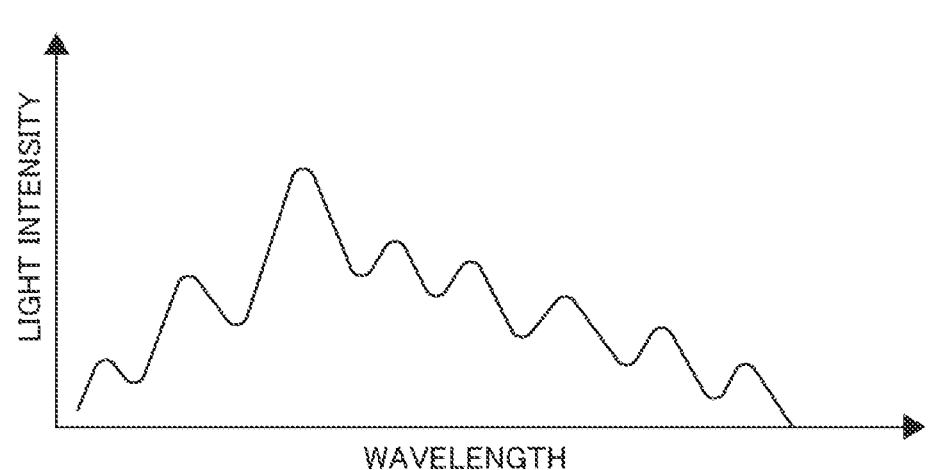
FIG. 3 shows a spectrum generated from first intensity measurement data.
Figure 4:
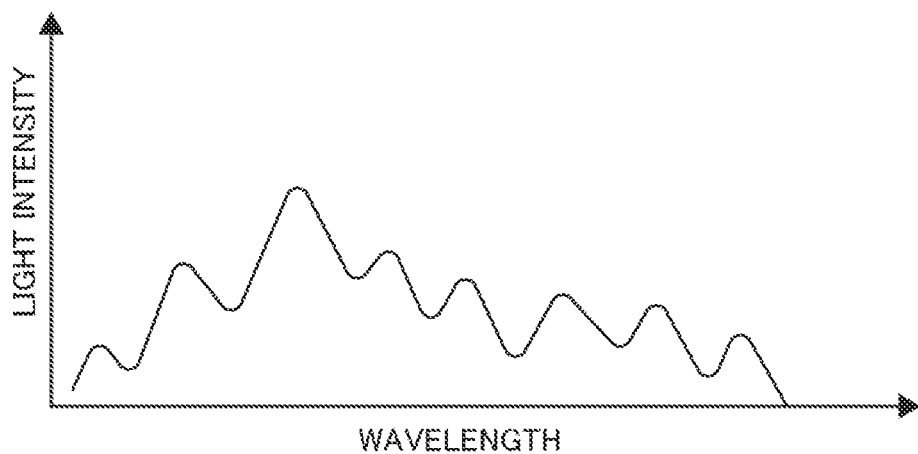
FIG. 4 shows a spectrum generated from corrected first base intensity data.
Figure 5:
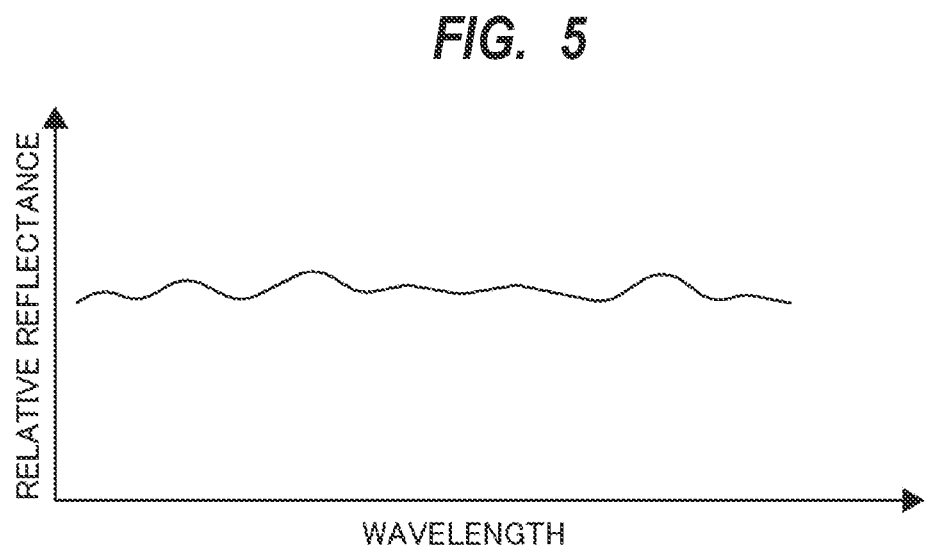

FIG. 3 shows a spectrum generated from the first intensity measurement data, FIG. 4 shows a spectrum generated from the corrected first base intensity data, and FIG. 5 shows a spectrum generated from the relative reflectance data obtained by dividing the first intensity measurement data by the corrected first base intensity data. A shape of the spectrum generated from the relative reflectance data varies according to the film thickness of the workpiece W. The processing system 30 generates a spectrum as shown in FIG. 5 from the relative reflectance data obtained by the above calculation formula, and determines the film thickness of the workpiece W based on the spectrum generated.

A known technique may be used for determining the film thickness of the workpiece W based on the spectrum. For example, the processing system 30 determines, from reference-spectra library, a reference spectrum that is closest in shape to the generated spectrum, and determines a film thickness associated with the determined reference spectrum. In another example, the processing system 30 performs a Fourier transform on the generated spectrum and determines a film thickness from a resultant frequency spectrum.

FIG. 6 is a flow chart describing one embodiment of a polishing method for polishing a workpiece W.

In step 101, before polishing of the workpiece W, the light emitted by the light source 22 is directed through the light-emitting optical fiber cable 31 and the light-receiving optical fiber cable 32 to the first spectrometer 27, and the intensity of the light is measured by the first spectrometer 27, so that the first base intensity data indicating the reference intensity of light is generated. The processing system 30 obtains the first base intensity data from the first spectrometer 27 and stores the first base intensity data in the memory 30a.

In step 102, before polishing of the workpiece W, the light emitted by the light source 22 is directed through the direct-coupling optical fiber cable 33 to the second spectrometer 28, and the intensity of the light is measured by the second spectrometer 28, so that the second base intensity data indicative of the reference intensity of the light of the light source 22 is generated. The processing system 30 obtains the second base intensity data from the second spectrometer 28 and stores the second base intensity data in the memory 30a. The measuring of the light intensity by the first spectrometer 27 in the step 101 and the measuring of the light intensity by the second spectrometer 28 in the step 102 are performed simultaneously.

In step 103, polishing of the workpiece W is started by pressing the workpiece W against the polishing pad 2 by the polishing head 1 while the polishing table 3 is rotated.

In step 104, during polishing of the workpiece W, the processing system 30 obtains the first intensity measurement data indicative of the intensity of reflected light from the workpiece W measured by the first spectrometer 27.

In step 105, during polishing of the workpiece W, the processing system 30 obtains the second intensity measurement data indicative of the intensity of light from the light source 22 measured by the second spectrometer 28. The measuring of the intensity of reflected light by the first spectrometer 27 in the step 104 and the measuring of the intensity of light of the light source 22 by the second spectrometer 28 in the step 105 are performed simultaneously.

In step 106, the processing system 30 calculates the rate of change in the second intensity measurement data with respect to the second base intensity data.

In step 107, the processing system 30 calculates the corrected first base intensity data by multiplying the first base intensity data by the rate of change.

In step 108, the processing system 30 calculates the relative reflectance data by dividing the first intensity measurement data by the corrected first base intensity data.

In step 109, the processing system 30 determines the film thickness of the workpiece W based on the relative reflectance data.

The rate of change k used in the above-described calculation formula may be a plurality of rates of change corresponding to a plurality of wavelengths, or may be a single rate of change determined for a plurality of wavelengths. The plurality of rates of change k(λ) corresponding to a plurality of wavelengths are given by $$k(\lambda)=MV2(\lambda)/BV2(\lambda),\ \lambda{=}\lambda LL \text{ to } \lambda HL \qquad (3)$$

where λ represents a wavelength of light, k(λ) represents a rate of change at wavelength λ, MV2(λ) represents an intensity of light at wavelength λ contained in the second intensity measurement data, and BV2(λ) represents an intensity of light at wavelength λ contained in the second base intensity data, λLL represents a lower limit of the wavelength range of the light intensity measured by the first spectrometer 27 and the second spectrometer 28, and λHL represents an upper limit of the above wavelength range. The wavelength λ is any one of wavelengths ranging from the lower limit λLL to the upper limit λHL.

According to this embodiment, since the rate of change is calculated for each wavelength, the first base intensity data can be corrected more accurately.

The above-described calculation formula (2) can be expressed as follows using formula (3), $$R(\lambda)=MV1(\lambda)/[BV1(\lambda) \cdot k(\lambda)], \lambda=\lambda LL \text{ to } \lambda HL \qquad (4)$$

where, $R(\lambda)$ represents a relative reflectance at wavelength $\lambda$, $MV1(\lambda)$ represents an intensity of the reflected light at the wavelength $\lambda$ contained in the first intensity measurement data MD1, and $BV1(\lambda)$ represents a reference intensity of light at the wavelength $\lambda$ contained in the first base intensity data BD1.

$MV1(\lambda)$, $BV1(\lambda)$, $MV2(\lambda)$, and $BV2(\lambda)$ included in the above formulas (3) and (4) are light intensities at the wavelength $\lambda$ measured by the first spectrometer 27 and the second spectrometer 28. Each of the first spectrometer 27 and the second spectrometer 28 is configured to decompose light according to wavelengths and measure the intensity of the light at each wavelength. However, due to a mechanical difference between the first spectrometer 27 and the second spectrometer 28, there may be a difference between the wavelength of the intensity measured by the first spectrometer 27 and the wavelength of the intensity measured by the second spectrometer 28. This issue will be described with reference to FIG. 7.

Figure 7:
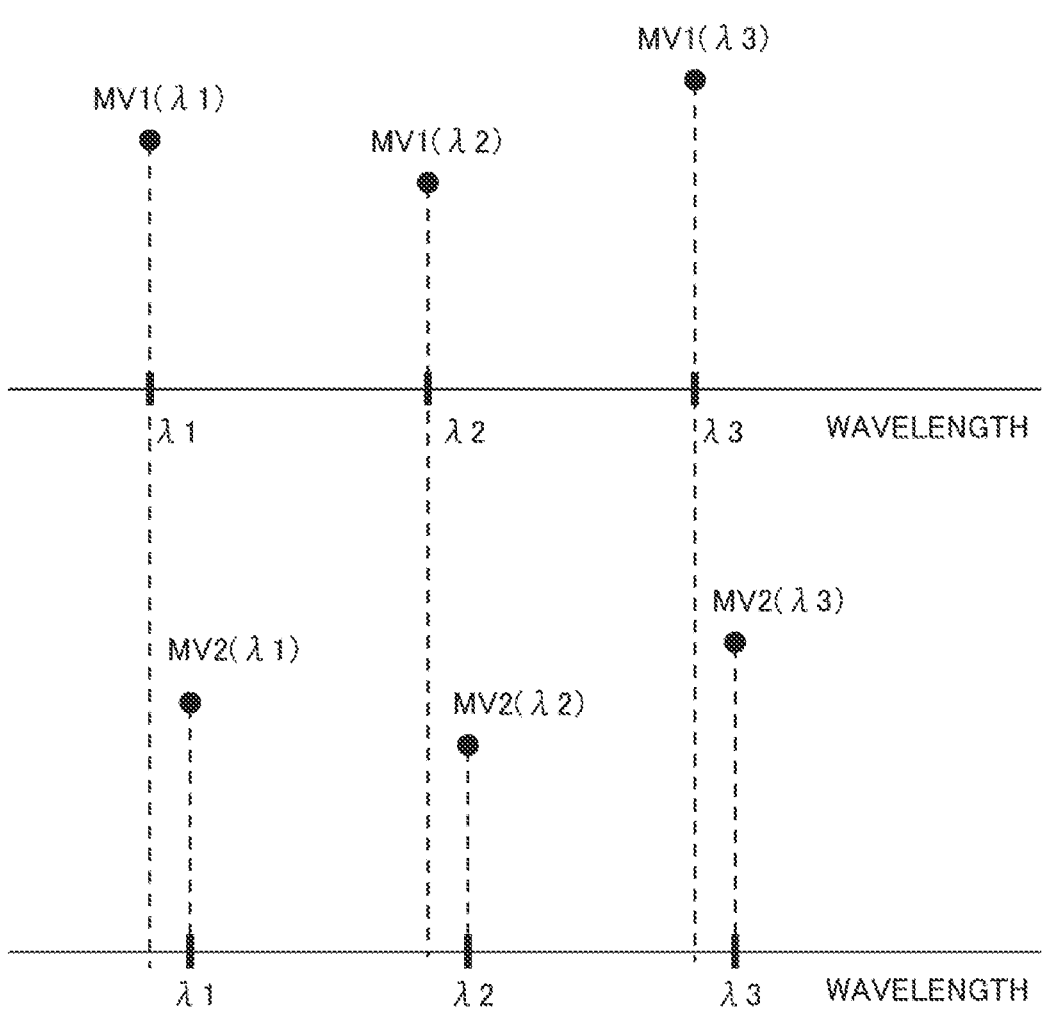
FIG. 7 is a graph showing intensities of light and their wavelengths measured by a first spectrometer and a second spectrometer.

FIG. 7 is a graph showing the light intensities and their wavelengths measured by the first spectrometer 27 and the second spectrometer 28. The first spectrometer 27 measures light intensities $MV1(\lambda1)$, $MV1(\lambda2)$, and $MV1(\lambda3)$ at wavelengths $\lambda1$, $\lambda2$, and $\lambda3$, and the second spectrometer 28 also measures $MV2(\lambda1)$, $MV2(\lambda2)$, and $MV2(\lambda3)$ at the wavelengths $\lambda1$, $\lambda2$, and $\lambda3$. However, as shown in FIG. 7, due to the mechanical difference between the first spectrometer 27 and the second spectrometer 28, the wavelengths $\lambda1$, $\lambda2$, and $\lambda3$ of the light intensities measured by the first spectrometer 27 are slightly different from the wavelengths $\lambda1$, $\lambda2$, and $\lambda3$ of the light intensities measured by the second spectrometer 28. Such difference in wavelength can adversely affect the accuracy of the relative reflectance data.

Thus, in one embodiment, the processing system 30 is configured to perform interpolation on the first base intensity data, the first intensity measurement data, the second base intensity data, and the second intensity measurement data such that the plurality of wavelengths of the first base intensity data and the first intensity measurement data coincide with the plurality of wavelengths of the second base intensity data and the second intensity measurement data. After the interpolation, the processing system 30 calculates the plurality of rates of change k and calculates the relative reflectance data.

Figure 8:
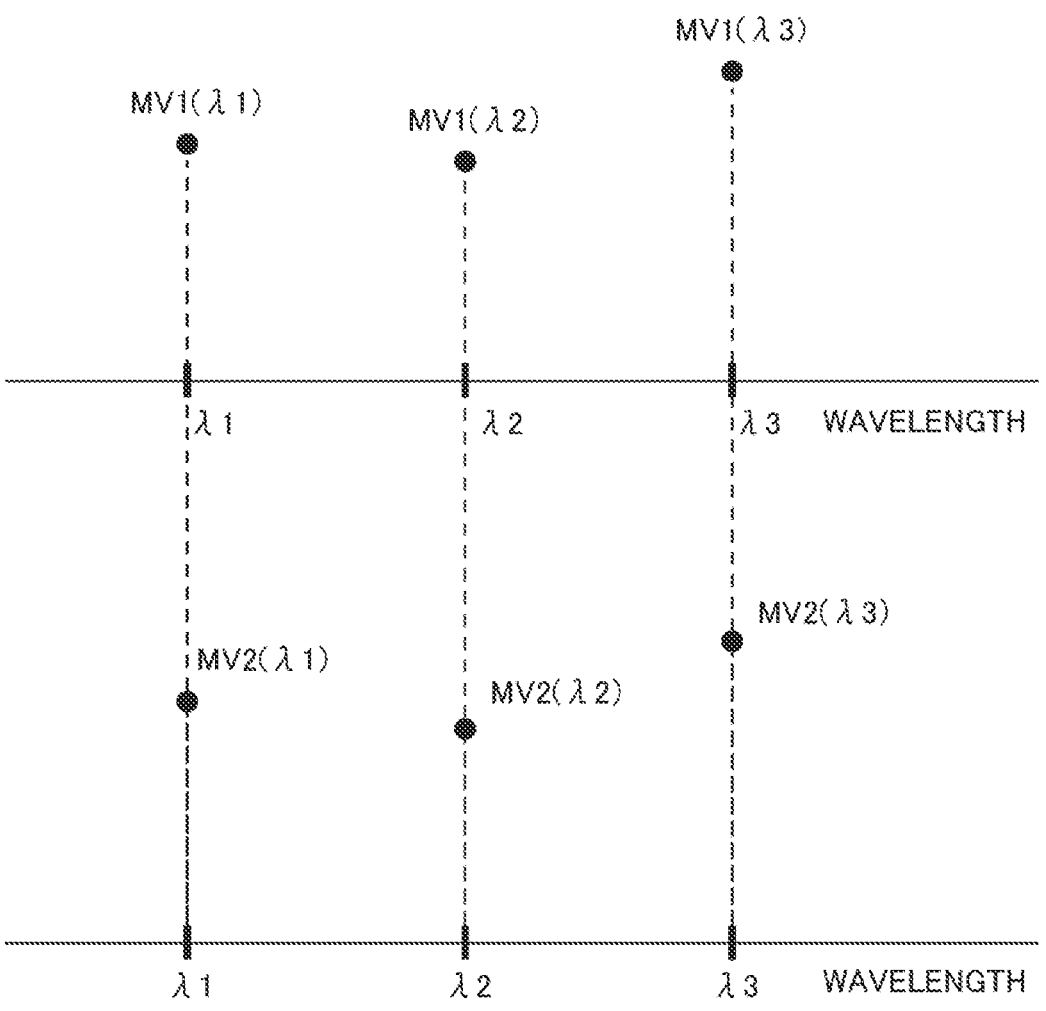
FIG. 8 is a graph showing a state in which the wavelengths of the light intensities measured by the first spectrometer and the wavelengths of the light intensities measured by the second spectrometer coincide with each other by interpolation.

FIG. 8 is a graph showing that the wavelengths $\lambda1$, $\lambda2$, and $\lambda3$ of the light intensities measured by the first spectrometer 27 coincide with the wavelengths $\lambda1$, $\lambda2$, and $\lambda3$ of the light intensities measured by the second spectrometer 28 as a result of the interpolation. In this example, the plurality of wavelengths $\lambda1$, $\lambda2$, $\lambda3$ of the interpolated first intensity measurement data and the plurality of wavelengths $\lambda1$, $\lambda2$, $\lambda3$ of the interpolated second intensity measurement data are integer wavelengths. Specifically, the processing system 30 performs the interpolation on the first intensity measurement data to determine light intensities $MV1(\lambda1)$, $MV1(\lambda2)$, $MV1(\lambda3)$ at integer wavelengths $\lambda1$, $\lambda2$, $\lambda3$, and further performs the interpolation on the second intensity measurement data to determine light intensities $MV2(\lambda1)$, $MV2(\lambda2)$, $MV2(\lambda3)$ at the integer wavelengths $\lambda1$, $\lambda2$, $\lambda3$. As a result, the wavelengths of the first intensity measurement data coincide with the wavelengths of the second intensity measurement data.

Similarly, the plurality of wavelengths $\lambda1$, $\lambda2$, and $\lambda3$ of the interpolated first base intensity data and the plurality of wavelengths $\lambda1$, $\lambda2$, and $\lambda3$ of the interpolated second base intensity data are integer wavelengths. Specifically, the processing system 30 performs the interpolation on the first base intensity data to determine light intensities $BV1(\lambda1)$, $BV1(\lambda2)$, $BV1(\lambda3)$ at integer wavelengths $\lambda1$, $\lambda2$, $\lambda3$, and further perform the interpolation on the second base intensity data to determine light intensities $BV2(\lambda1)$, $BV2(\lambda2)$, $BV2(\lambda3)$ at the integer wavelengths $\lambda1$, $\lambda2$, $\lambda3$. As a result, the wavelengths of the first base intensity data coincide with the wavelengths of the second base intensity data.

As a result of these operations, the wavelengths of the light intensities within the wavelength range measured by the first spectrometer 27 and the second spectrometer 28 are all the same.

In one embodiment, the rate of change k may be a single rate of change defined for a plurality of wavelengths. In this case, the interpolation described above is not necessary. The processing system 30 determines a representative intensity value for the second base intensity data and a representative intensity value for the second intensity measurement data, and calculates a rate of change k in the representative intensity value for the second intensity measurement data with respect to the representative intensity value for the second base intensity data. Examples of the representative intensity value include an average value, a local maximum value, and a maximum value of a plurality of intensities corresponding to the plurality of wavelengths.

According to the embodiments described above, the processing system 30 can not only remove a variation in the light emission of the light source 22, but also can remove a change in the quantity of light of the light source 22 over time. Specifically, both the variation in the light emission of the light source 22 and the temporal change in the quantity of light of the light source 22 can be expressed as a change in the second intensity measurement data with respect to the second base intensity data. Therefore, the processing system 30 can eliminate not only the variation in the light emission of the light source 22 but also can eliminate the temporal change in the quantity of light of the light source 22 over time by executing the data processing using the calculation formula(s) discussed above.

Next, another embodiment of the polishing apparatus will be described. Configurations and operations of this embodiment, which will not be particularly described, are the same as those of the embodiments described with reference to FIGS. 1 and 2, and redundant descriptions thereof will be omitted.

Figure 9:
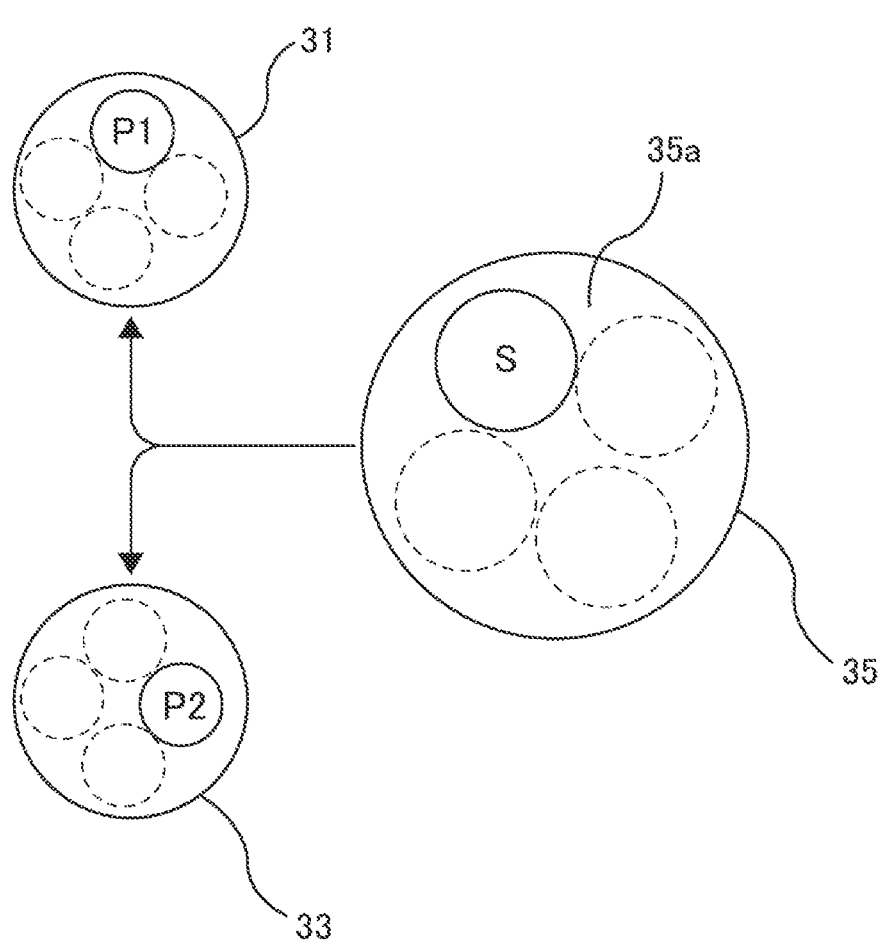
FIG. 9 is a schematic diagram showing a position of an incident spot of light on an end surface of a trunk optical fiber cable and optical paths of light in a light-emitting optical fiber cable and a direct-coupling optical fiber cable.

As shown in FIG. 2, the light source 22 is coupled to the trunk optical fiber cable 35. The light emitted by the light source 22 is first incident on the end surface of the trunk optical fiber cable 35, and then distributed to the light-emitting optical fiber cable 31 and the direct-coupling optical fiber cable 33. FIG. 9 is a schematic diagram showing position of the incident spot of light on an end surface 35a of the trunk optical fiber cable 35 and optical paths of the light in the light-emitting optical fiber cable 31 and the direct-coupling optical fiber cable 33. As shown in FIG. 9, an incident spot S of the light emitted by the light source 22 is smaller than the end surface 35a of the trunk optical fiber cable 35, and the incident spot S is located within the end surface 35a of the trunk optical fiber cable 35.

During polishing of the workpiece W, the light source 22 repeatedly emits the light at short time intervals. The position of the incident spot S of the light within the end surface 35a of the trunk optical fiber cable 35 is not constant and changes each time the light source 22 emits the light. An optical path P1 of the light traveling through the light-emitting optical fiber cable 31 (i.e., a spot position of the light in the light-emitting optical fiber cable 31) and an optical path P2 of the light traveling through the direct-coupling optical fiber cable 33 vary depending on the position of the incident spot S of the light within the end surface 35a of the trunk optical fiber cable 35. Circles depicted by dotted line in FIG. 9 indicate a change in the position of the incident spot S of the light and corresponding changes in the optical paths P1 and P2. Such changes in the optical paths P1 and P2 in the light-emitting optical fiber cable 31 and the direct-coupling optical fiber cable 33 cause a change in the spectrum of the reflected light from the workpiece W.

Although the optical path P1 in the light-emitting optical fiber cable 31 and the optical path P2 in the direct-coupling optical fiber cable 33 change, there is a one-to-one relationship between the positions of the optical paths P1 and P2 in the optical fiber cables 31 and 33. In other words, the position of the optical path P1 of light traveling in the light-emitting optical fiber cable 31 uniquely corresponds to the position of the optical path. P2 of light traveling in the direct-coupling optical fiber cable 33. The second intensity measurement data representing the intensity of the light of the light source 22 measured by the second spectrometer 28 during polishing of the workpiece W varies depending on the optical path P2 of the light traveling in the direct-coupling optical fiber cable 33, i.e., depending on the position of the incident spot S of light within the end surface 35a of the trunk optical fiber cable 35. Therefore, the first intensity measurement data indicating the intensity of the reflected light from the workpiece W measured by the first spectrometer 27 during polishing of the workpiece W also varies while maintaining one-to-one relationship with the second intensity measurement data.

In this embodiment, before polishing of the workpiece W, the light intensity is measured by the first spectrometer 27 and the second spectrometer 28 while the light source 22 repeatedly emits the light, so that a plurality of first base intensity data and a plurality of second base intensity data are generated. Each second base intensity data is generated at the same timing as each first base intensity data is generated before polishing of the workpiece W. Specifically, the first spectrometer 27 measures intensities of tight transmitted from the optical sensor head 25 over a predetermined wavelength range, while the second spectrometer 28 measures intensities of light from the light source 22 over the same wavelength range.

Each time the light source 22 emits light, the position of the incident spot S of the light within the end surface 35a of the trunk optical fiber cable 35 changes. Accordingly, the plurality of different first base intensity data and the plurality of different second base intensity data are generated. A reference library containing the plurality of different first base intensity data and the plurality of different second base intensity data is stored in the memory 30a of the processing system 30. The plurality of different first base intensity data and the plurality of different second base intensity data are associated with each other in a one-to-one correspondence relationship.

The processing system 30 obtains the first intensity measurement data indicating the intensity of the reflected light from the workpiece W measured by the first spectrometer 27 during polishing of the workpiece W, and obtains the second intensity measurement data indicating the intensity of light of the light source 22 measured by the second spectrometer 28 during polishing of the workpiece W. The second intensity measurement data is generated during polishing of the workpiece W at the same timing as the first intensity measurement data is generated. Specifically, the first spectrometer 27 measures intensities of the reflected light from the workpiece W over a predetermined wavelength range, while the second spectrometer 28 measures intensities of the light from the light source 22 over the same wavelength range.

The processing system 30 selects, from the plurality of different base second intensity data contained in the reference library, one second base intensity data that best matches the second intensity measurement data (i.e., coincides with the second intensity measurement data most). The processing system 30 then determines the first base intensity data associated with the selected second base intensity data, "Best match (or coincide most)" includes not only being most similar, but also exact match. Curve fining, reproduction discrimination, or other technique can be used as a method for selecting the second base intensity data that best matches the second intensity measurement data (i.e., a method for determining the similarity of intensity data).

The spectrum of the reflected light from the workpiece W is affected by the optical path in the light-emitting optical fiber cable 31. Therefore, if the intensity data of lights that have passed through different optical paths are used in the calculation of the relative reflectance from the first intensity measurement data and the first base intensity data, such different optical paths affect the calculation, and as a result, an accurate film thickness cannot be determined. On the other hand, the first base intensity data and the second base intensity data have a correspondence relationship, because these are the intensity data of light that has passed through the same optical path. Similarly, the first intensity measurement data and the second intensity measurement data have a correspondence relationship, because these are the intensity data of light that has passed through the same optical path. Therefore, the processing system 30 selects, from the plurality of second base intensity data, one second base intensity data having similarity of spectrum of light that is supposed to have passed through the same optical path in the direct-coupling optical fiber cable 33 as the light of the second intensity measurement data. Furthermore, the processing system 30 determines the first base intensity data corresponding to (i.e., measured at the same time as) the selected second base intensity data. The processing system 30 then calculates the relative reflectance from the first intensity measurement data and the determined first base intensity data. These operations can eliminate the effect of the optical path, and can therefore improve the accuracy of the film thickness measurement.

The processing system 30 calculates the relative reflectance data by dividing the first intensity measurement data by the determined first base intensity data, and determines the film thickness of the workpiece W based on the relative reflectance data. As a result of such dividing operation, the change in the position of the incident spot S of light within the end surface 35a of the trunk optical fiber cable 35 is removed from the relative reflectance data. As a result, the processing system 30 can determine an accurate film thickness from the relative reflectance data.

FIG. 10 is a flow chart describing one embodiment of a polishing method for polishing a workpiece W.

In step 201, before polishing of the workpiece W, the light repeatedly emitted by the light source 22 is directed through the light-emitting optical fiber cable 31 and the light-receiving optical fiber cable 32 to the first spectrometer 27, and the intensity of the light is measured by the first spectrometer 27, so that a plurality of different first base intensity data each indicative of reference intensity of light are generated. The processing system 30 obtains the plurality of different first base intensity data from the first spectrometer 27 and stores them in the memory 30a.

In step 202, before polishing of the workpiece W, the light repeatedly emitted by the light source 22 is directed through the direct-coupling optical fiber cable 33 to the second spectrometer 28, and the intensity of the light is measured by the second spectrometer 28, so that a plurality of different second base intensity data each indicative of the reference intensity of the light of the light source 22 are generated. The processing system 30 obtains the plurality of different second base intensity data from the second spectrometer 28 and stores them in the memory 30a. Measuring of the light intensity by the first spectrometer 27 in the step 201 and measuring of the light intensity by the second spectrometer 28 in the step 202 are performed simultaneously.

In step 203, polishing of the workpiece W is started by pressing the workpiece W against the polishing pad 2 by the polishing head 1 while the polishing table 3 is rotated.

In step 204, during polishing of the workpiece W, the processing system 30 obtains the first intensity measurement data indicative of the intensity of the reflected light from the workpiece W measured by the first spectrometer 27.

In step 205, during polishing of workpiece W, the processing system 30 obtains the second intensity measurement data indicative of the intensity of the light from the light source 22 measured by second spectrometer 28. Measuring of the intensity of the reflected light by the first spectrometer 27 in the step 204 and measuring of the intensity of the light of the light source 22 by the second spectrometer 28 in the step 205 are performed simultaneously.

In step 206, the processing system 30 selects second base intensity data that best matches the second intensity measurement data (i.e., coincides with the second intensity measurement data most) from the plurality of different base second intensity data.

In step 207, the processing system 30 determines first base intensity data associated with the selected second base intensity data.

In step 208, the processing system 30 calculates the relative reflectance data by dividing the first intensity measurement data by the determined first base intensity data.

In step 209, the processing system 30 determines the film thickness of the workpiece W based on the relative reflectance data.

Figure 11:
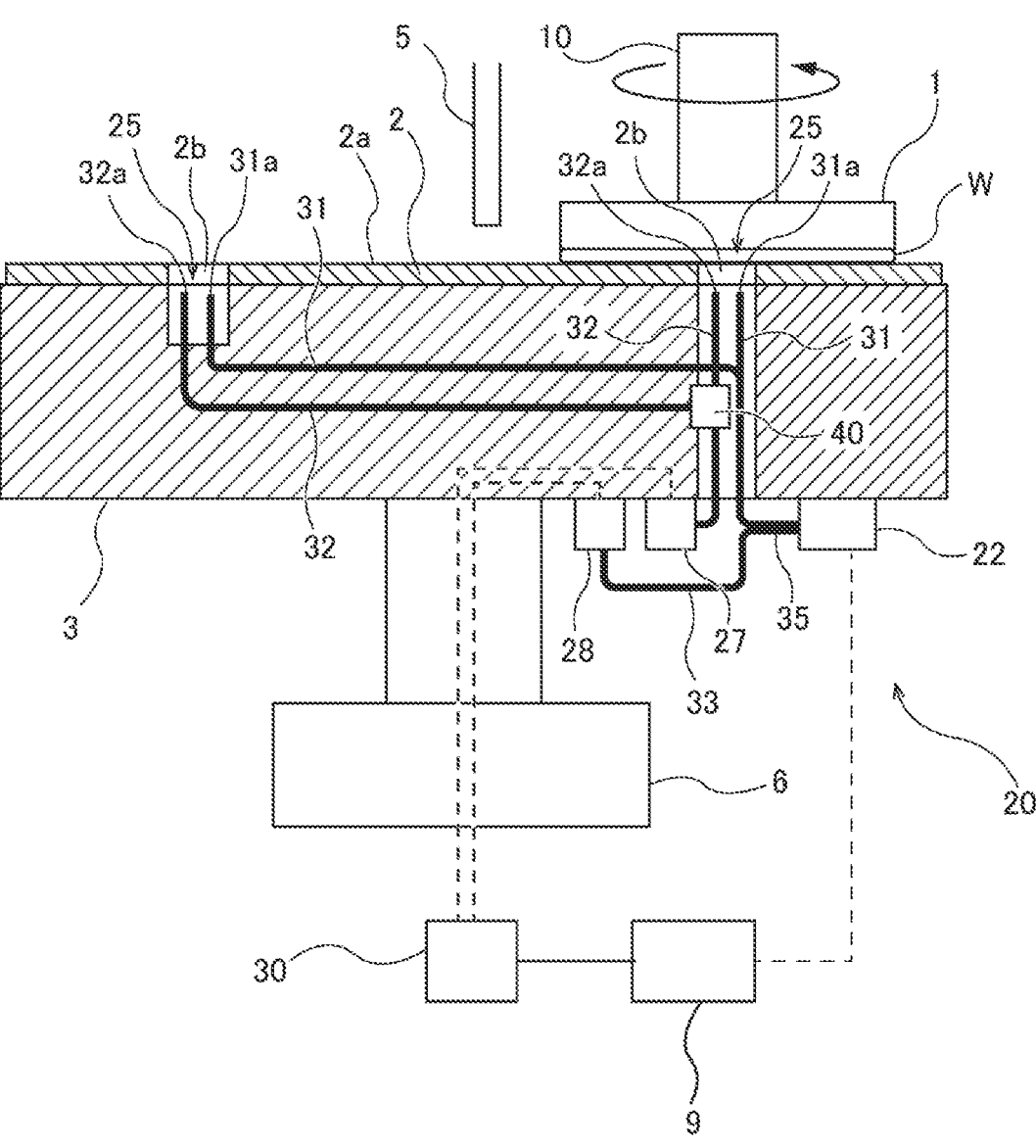
FIG. 11 is a schematic diagram showing another embodiment of the polishing apparatus.

Although one optical sensor head 25 is provided in the embodiments described previously, the present invention is not limited to the above embodiments, and a plurality of optical sensor heads 25 may be provided in the polishing table 3. For example, as shown in FIG. 11, light-receiving optical fiber cables 32 constituting a plurality of optical sensor heads 25 may be coupled to the first spectrometer 27 via an optical-path switching device 40, such as an optical switch or a shutter. Positions of the plurality of optical sensor heads 25 are not particularly limited. For example, the plurality of optical sensor heads 25 may be arranged at positions such that the plurality of optical sensor heads 25 move across the center and an edge portion of the workpiece W. In the embodiment shown in FIG. 11, two optical sensor heads 25 are provided, while three or more optical sensor heads 25 may be provided.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing apparatus for polishing a workpiece, comprising:

a polishing table configured to support a polishing pad;

a polishing head configured to press the workpiece against the polishing pad to polish the workpiece;

a light source configured to emit light;

a light-emitting optical fiber cable coupled to the light source and configured to direct the light to the workpiece;

a light-receiving optical fiber cable configured to receive reflected light from the workpiece;

a first spectrometer coupled to the light-receiving optical fiber cable;

a second spectrometer directly coupled to the light source; and a processing system including a memory storing a program and an arithmetic device configured to perform an arithmetic operation according to instructions included in the program, the memory storing therein first base intensity data indicating reference intensity of light measured by the first spectrometer before polishing of the workpiece, the memory storing therein second base intensity data indicating reference intensity of the light of the light source measured by the second spectrometer before polishing of the workpiece, the memory storing therein a calculation formula for calculating relative reflectance data, the processing system being configured to determine, during polishing of the workpiece, a film thickness of the workpiece based on the relative reflectance data, the calculation formula being expressed as $$\text{the relative reflectance data} = MD1/[BD1 \cdot k]$$

where MD1 represents first intensity measurement data indicating intensity of the reflected light from the workpiece measured by the first spectrometer, BD1 represents the first base intensity data, and k represents a rate of change in second intensity measurement data with respect to the second base intensity data, and the second intensity measurement data is indicative of intensity of the light of the light source measured by the second spectrometer during polishing of the workpiece.

2. The polishing apparatus according to claim 1, wherein each of the first base intensity data, the second base intensity data, the first intensity measurement data, and the second intensity measurement data is data indicating intensities of light at a plurality of wavelengths, and the rate of change k comprises a plurality of rates of change corresponding to the plurality of wavelengths, respectively.

3. The polishing apparatus according to claim 2, wherein the processing system is configured to:

perform interpolation on the first base intensity data, the first intensity measurement data, the second base intensity data, and the second intensity measurement data such that the plurality of wavelengths of the first base intensity data and the first intensity measurement data coincide with the plurality of wavelengths of the second base intensity data and the second intensity measurement data; and then calculate the plurality of rates of change k.

4. The polishing apparatus according to claim 3, wherein the plurality of wavelengths of the first base intensity data, the second base intensity data, the first intensity measurement data, and the second intensity measurement data are a plurality of integer wavelengths.

5. The polishing apparatus according to claim 1, wherein the rate of change k is a rate of change in a representative intensity value of the second intensity measurement data with respect to a representative intensity value of the second base intensity data.

6. The polishing apparatus according to claim 1, wherein the first spectrometer and the second spectrometer are configured to simultaneously measure the intensity of the reflected light from the workpiece and the intensity of the light of the light source.

7. The polishing apparatus according to claim 1, further comprising a direct-coupling optical fiber cable that directly couples the light source to the second spectrometer.

8. A polishing method of polishing a workpiece, comprising:

before polishing of the workpiece, directing light, emitted by a light source, through a light-emitting optical fiber cable and a light-receiving optical fiber cable to a first spectrometer, and measuring intensity of the light by the first spectrometer to generate first base intensity data indicative of reference intensity of the light;

before polishing of the workpiece, measuring intensity of the light, emitted by the light source, by a second spectrometer to generate second base intensity data indicative of reference intensity of the light, the second spectrometer being directly coupled to the light source;

polishing the workpiece by pressing the workpiece against a polishing pad on a polishing table while rotating the polishing table;

obtaining first intensity measurement data indicative of intensity of reflected light from the workpiece measured by the first spectrometer during polishing of the workpiece;

obtaining second intensity measurement data indicative of intensity of the light of the light source measured by the second spectrometer during polishing of the workpiece;

calculating a rate of change in the second intensity measurement data with respect to the second base intensity data;

calculating corrected first base intensity data by multiplying the first base intensity data by the rate of change;

calculating relative reflectance data by dividing the first intensity measurement data by the corrected first base intensity data; and determining a film thickness of the workpiece based on the relative reflectance data.

9. The polishing method according to claim 8, wherein each of the first base intensity data, the second base intensity data, the first intensity measurement data, and the second intensity measurement data is data indicating intensities of light at a plurality of wavelengths, and the rate of change comprises a plurality of rates of change corresponding to the plurality of wavelengths, respectively.

10. The polishing method according to claim 9, further comprising performing interpolation on the first base intensity data, the first intensity measurement data, the second base intensity data, and the second intensity measurement data such that the plurality of wavelengths of the first base intensity data and the first intensity measurement data coincide with the plurality of wavelengths of the second base intensity data and the second intensity measurement data, the interpolation being performed before calculating the plurality of rates of change.

11. The polishing method according to claim 10, wherein the plurality of wavelengths of the first base intensity data, the second base intensity data, the first intensity measurement data, and the second intensity measurement data are a plurality of integer wavelengths.

12. The polishing method according to claim 8, wherein the rate of change is a rate of change in a representative intensity value of the second intensity measurement data with respect to a representative intensity value of the second base intensity data.

13. The polishing method according to claim 8, wherein the first spectrometer and the second spectrometer simultaneously measure the intensity of the reflected light from the workpiece and the intensity of the light from the light source.

* * * * *